(12) United States Patent
Toyomaki et al.

(10) Patent No.: US 11,735,448 B2
(45) Date of Patent: Aug. 22, 2023

(54) CONTAINER, CONTAINER PARTITION PLATE, SUBSTRATE PROCESSING SYSTEM, AND SUBSTRATE TRANSFER METHOD

(71) Applicant: TOKYO ELECTRON LIMITED, Tokyo (JP)

(72) Inventors: Toshiaki Toyomaki, Miyagi (JP); Seiichi Kaise, Miyagi (JP); Masahiro Numakura, Miyagi (JP); Yuki Takeyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 190 days.

(21) Appl. No.: 16/809,741

(22) Filed: Mar. 5, 2020

(65) Prior Publication Data
US 2020/0286752 A1 Sep. 10, 2020

(30) Foreign Application Priority Data
Mar. 7, 2019 (JP) .................... 2019-041408

(51) Int. Cl.
H01L 21/67 (2006.01)
H01L 21/673 (2006.01)
H01L 21/687 (2006.01)
B65G 47/90 (2006.01)

(52) U.S. Cl.
CPC .......... *H01L 21/6732* (2013.01); *B65G 47/90* (2013.01); *H01L 21/67167* (2013.01); *H01L 21/67265* (2013.01); *H01L 21/68707* (2013.01)

(58) Field of Classification Search
CPC ................ H01L 21/67265; H01L 21/6732
See application file for complete search history.

(56) References Cited

U.S. PATENT DOCUMENTS

| 7,219,802 B2* | 5/2007 | Wiseman ............ H01L 21/6732 |
| | | 211/41.18 |
| 7,325,692 B2* | 2/2008 | Nanjo ............... H01L 21/67309 |
| | | 211/41.18 |
| 9,865,485 B2* | 1/2018 | Knopfle ........... H01L 21/67265 |
| 9,881,820 B2* | 1/2018 | Wong ................ H01L 21/67383 |
| 10,304,717 B2* | 5/2019 | Genetti ............. H01L 21/67196 |
| 2003/0066810 A1* | 4/2003 | Chu .................. H01L 21/67724 |
| | | 211/41.18 |

(Continued)

FOREIGN PATENT DOCUMENTS

| JP | 2003-168715 A | 6/2003 |
| JP | 2010-219209 A | 9/2010 |

(Continued)

*Primary Examiner* — Mark C Hageman
(74) *Attorney, Agent, or Firm* — Weihrouch IP

(57) ABSTRACT

A container for consumables includes multiple holding portions, a partition plate and a fixer. The multiple holding portions are configured to respectively accommodate the consumables, each of which is loaded into and unloaded from one direction. The partition plate includes a first portion formed to be disposed between a light emitting part and a light receiving part of a detector, and the partition plate is accommodated in one of the multiple holding portions. The fixer is configured to fix the container so that the consumables are arranged on a transfer path to be loaded into and unloaded from the multiple holding portions.

10 Claims, 6 Drawing Sheets

(56) References Cited

U.S. PATENT DOCUMENTS

2019/0279887 A1* 9/2019 Ma .................... H01L 21/67109
2021/0098270 A1* 4/2021 Uchida ............. H01L 21/67051

FOREIGN PATENT DOCUMENTS

| | | |
|---|---|---|
| JP | 2011-054933 A | 3/2011 |
| JP | 2017-98540 A | 6/2017 |
| TW | 201400383 A | 1/2014 |
| TW | 201719749 A | 6/2017 |
| TW | 201726509 A | 8/2017 |
| WO | 2017/189770 A1 | 11/2017 |

* cited by examiner

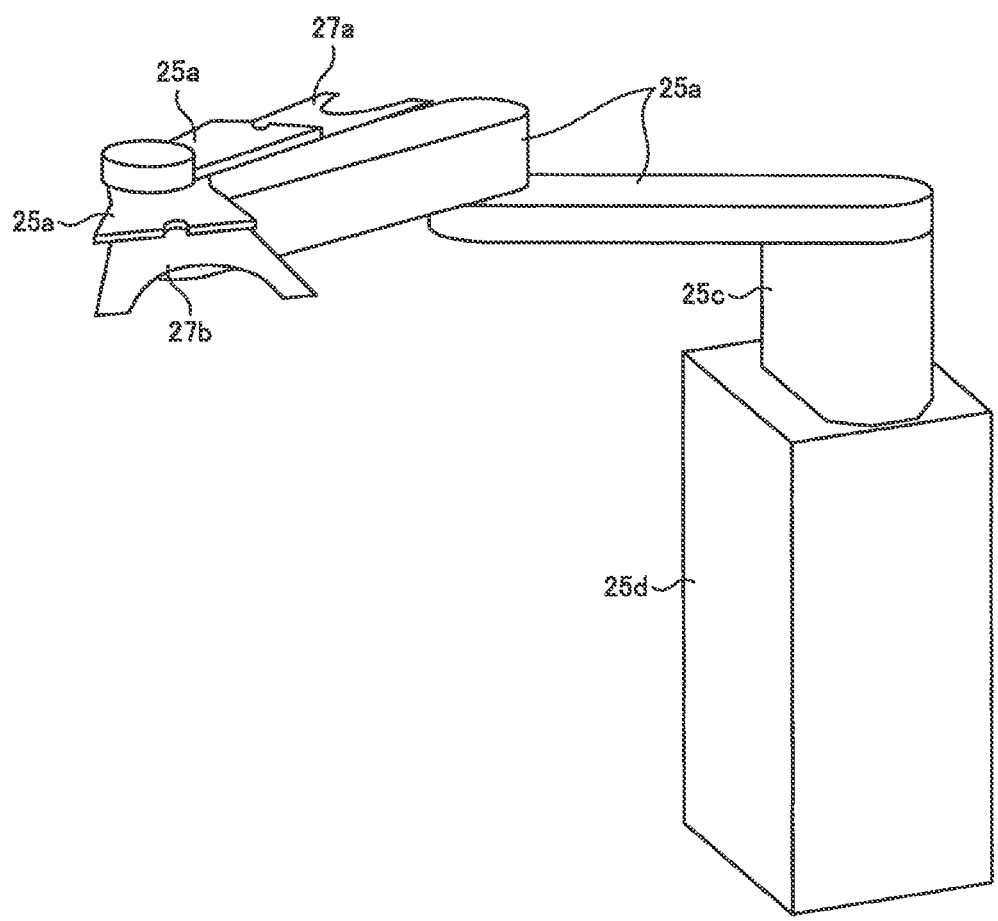

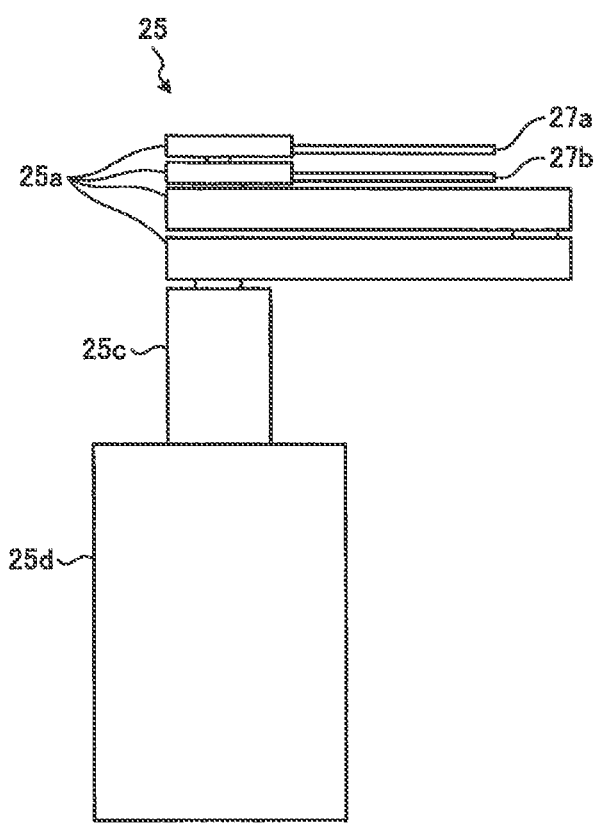

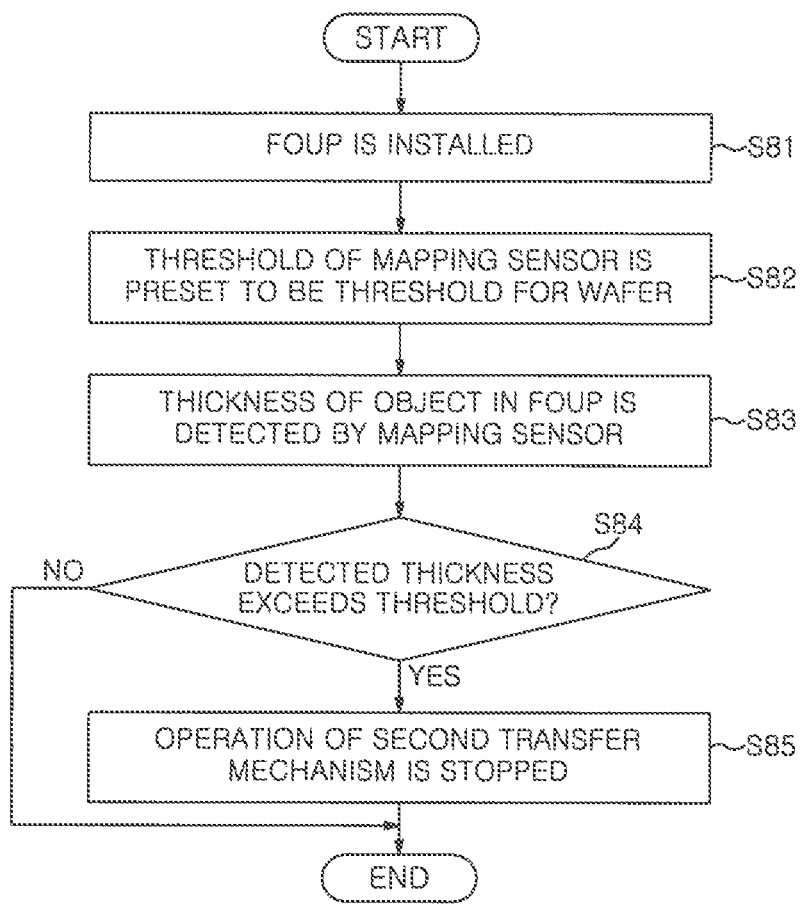

CONTAINER, CONTAINER PARTITION PLATE, SUBSTRATE PROCESSING SYSTEM, AND SUBSTRATE TRANSFER METHOD

CROSS-REFERENCE TO RELATED APPLICATIONS

This application claims priority to Japanese Patent Application No. 2019-041408, filed on Mar. 7, 2019, the entire contents of which are incorporated herein by reference.

TECHNICAL FIELD

The present disclosure relates to a container, a partition plate of the container, a system for processing a substrate, and a method of transferring the substrate.

BACKGROUND

There is known a system in which a carrier accommodating a substrate (e.g., a semiconductor substrate, hereinafter also referred to as "wafer") is disposed near a substrate processing apparatus and the substrate is automatically transferred from the carrier (see, e.g., Japanese Patent Application Publication No. 2003-168715). In addition, it is suggested to use a robot used for loading and unloading a wafer into and from a substrate processing apparatus to also load, unload, and replace a consumable (see, e.g., Japanese Patent Application Publication No. 2017-98540).

In view of the above, the present disclosure provides a technique capable of preventing the erroneous transfer of a substrate and a consumable.

SUMMARY

In accordance with an aspect of the present disclosure, there is provided a container for consumables, including: multiple holding portions configured to respectively accommodate the consumables, each of which is loaded and unloaded in one direction; a partition plate including a first portion formed to be disposed between a light emitting part and a light receiving part of a detector, the partition plate being accommodated in one of the multiple holding portions; and a fixer configured to fix the container so that the consumables are arranged on a transfer path to be loaded into and unloaded from the multiple holding portions.

BRIEF DESCRIPTION OF THE DRAWINGS

The objects and features of the present disclosure will become apparent from the following description of embodiments, given in conjunction with the accompanying drawings, in which:

FIG. 6 is a schematic perspective view of a second transfer mechanism;

FIG. 7 is a schematic front view of the second transfer mechanism; and

FIG. 8 is a flowchart showing an example of a sequence of a method of transferring the substrate according to the embodiment.

DETAILED DESCRIPTION

Embodiments will now be described in detail with reference to the accompanying drawings. However, the following embodiments are not intended to limit the present disclosure. The following embodiments may be appropriately combined without contradicting processing contents.

(System 1 for Processing a Substrate According to Embodiment)

Figure 1:
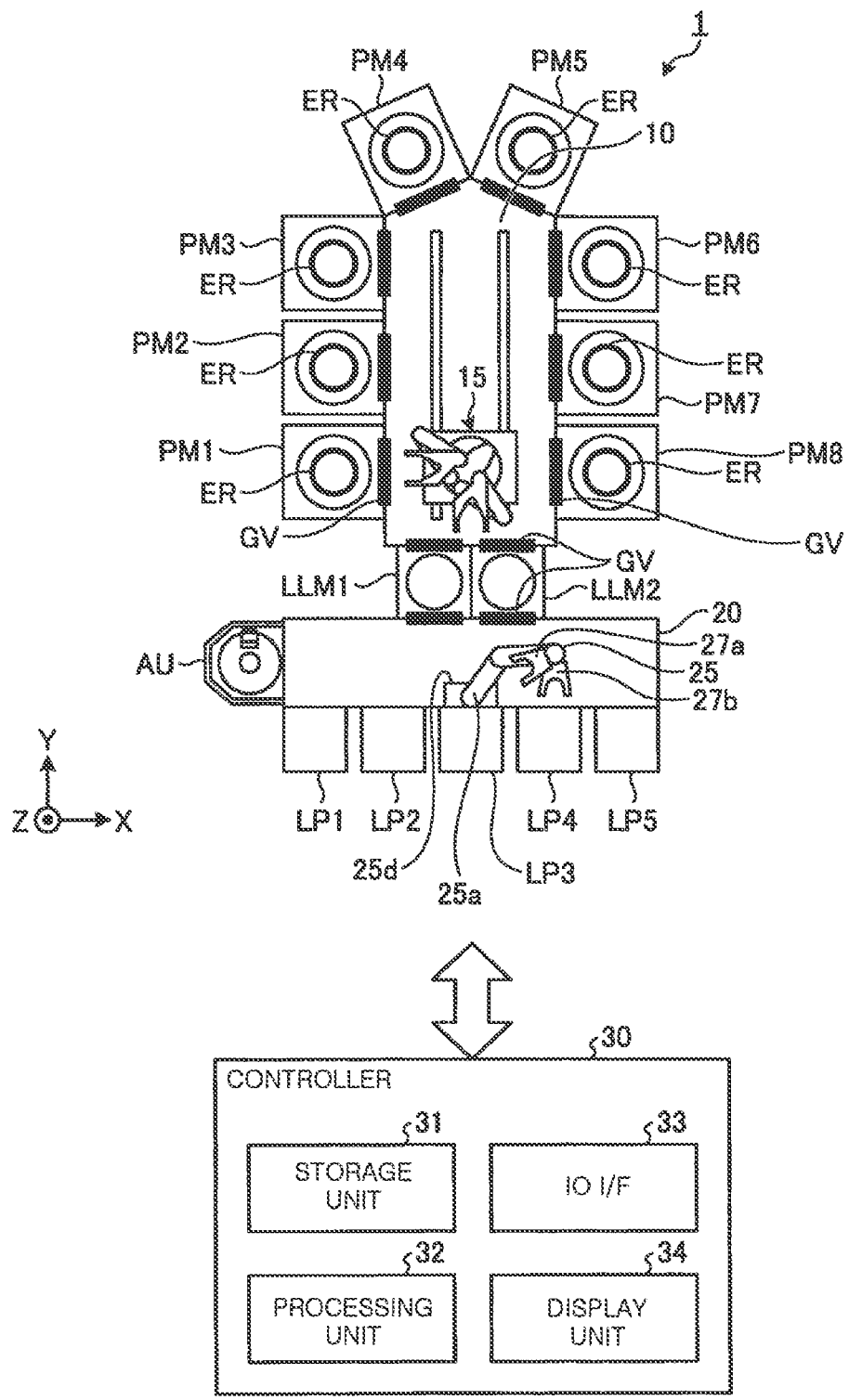
FIG. 1 schematically shows a system for processing a substrate according to an embodiment.

FIG. 1 schematically shows a system for processing a substrate (hereinafter simply referred to as system) according to an embodiment. The system 1 includes a plurality of vacuum processing chambers (also referred to as "processing modules") PMs (PM1 to PM8), a vacuum transfer chamber 10, and an atmospheric pressure transfer chamber 20. The system 1 further includes at least two load-lock modules LLMs (LLM1 and LLM2), a plurality of load ports LPs (LP1 to LP5), an aligner AU, and a controller 30. The number of the vacuum processing chambers PMs, the number of the load-lock modules LLMs, and the number of the load ports LPs of the system 1 are examples and should not be limited to the illustrated numbers in FIG. 1.

FIG. 1 illustrates eight processing modules PM1 to PM8, two load-lock modules LLM1 and LLM2, and five load ports LP1 to LP5. Hereinafter, the eight processing modules PM1 to PM8 will be collectively referred to as "processing modules PM" unless otherwise stated. Similarly, the two load-lock modules LLM1 and LLM2 will be collectively referred to as "load-lock modules LLM." Similarly, the five load ports LP1 to LP5 will be collectively referred to as "load ports LP." The system 1 of the present embodiment includes at least two load-lock modules LLM.

In the processing module PM, a wafer W is processed under a reduced atmosphere. The processing module PM performs a variety of treatments such as etching and formation of films, for example. The processing module PM includes a table for supporting the wafer W and an edge ring ER disposed on the table to surround the wafer W. The processing module PM is maintained in a reduced atmosphere during the treatment of the wafer W. Each processing module PM is connected to the vacuum transfer chamber 10 through a gate valve GV.

The inside of the vacuum transfer chamber 10 can be maintained in a reduced atmosphere. The wafer W is transferred to each processing module through the vacuum transfer chamber 10. A wafer W processed in one processing module PM can be transferred to a subsequent processing module PM for performing subsequent processing through the vacuum transfer chamber 10. The wafer W that has been subjected to all of the processing is transferred to the load-lock module LLM through the vacuum transfer chamber 10.

A first transfer mechanism 15 for transferring the wafer W and the edge ring ER is disposed in the vacuum transfer chamber 10. The first transfer mechanism 15 transfers the wafer W and the edge ring ER between the processing modules PM1 to PM8 and the load-lock modules LLM1 and LLM2.

Each load-lock module LLM includes a table and support pins for raising and lowering the wafer W and the edge ring ER. An inner atmosphere of the load-lock module LLM can be switched between an atmospheric atmosphere and a reduced atmosphere. The load-lock modules LLMs are disposed side by side along one side of the vacuum transfer chamber 10 where the processing modules PM are not disposed. The load-lock modules LLMs and the vacuum transfer chamber 10 communicate with each other through gate valves GV. The load-lock modules LLMs are connected to the atmospheric pressure transfer chamber 20 on the side remote from the vacuum transfer chamber 10. The load-lock modules LLMs and the atmospheric pressure transfer chamber 20 communicate with each other through gate valves G.

The atmospheric pressure transfer chamber 20 is maintained in an atmospheric pressure atmosphere. The load-lock modules LLMs are disposed along one longitudinal side of the atmospheric pressure transfer chamber 20. The load ports LPs are disposed along the other longitudinal side of the atmospheric pressure transfer chamber 20. A second transfer mechanism 25 for transferring a transfer object between the load-lock modules LLMs and the load ports LPs is disposed in the atmospheric pressure transfer chamber 20. The second transfer mechanism 25 has an arm 25a. The arm 25a is rotatably fixed on a base 25d. The base 25d is fixed near the load port LP3. A substantially U-shaped first pick 27a and a substantially U-shaped second pick 27b are rotatably connected to a tip end of the arm 25a.

At least one of the first pick 27a and the second pick 27b has mapping sensors MS (see FIG. 3) at the tip end thereof. For example, the mapping sensors MS are disposed at two end portions of the U-shaped tip end of each of the first pick 27a and the second pick 27b. The mapping sensor MS is an example of a detector. For example, the mapping sensor MS detects the presence and the position of the wafer W and the edge ring ER in a Front Opening Unified Pod to be described later, and transmits the detection result to the controller 30 (to be described later).

A container (hereinafter also referred to as "Front Opening Unified Pod (FOUP)") accommodating the wafer W or the edge ring ER can be mounted on each load port LP. The FOUP is a container that accommodates the wafer W or the edge ring ER. The FOUP has a lid (not shown). When the FOUP is mounted on the load port LP, the lid of the FOUP and the door of the load port LP are engaged. In this state, if the door of the load port LP is opened, the lid of the FOUP is moved together with the door. Accordingly, the FOUP is opened and the inside of the FOUP communicates with the inside of the atmospheric pressure transfer chamber 20 through the load port LP. The FOUP according to the embodiment includes a wafer FOUP capable of accommodating the wafer W and an edge ring (ER) FOUP capable of accommodating the edge ring ER. The number of holding portions and pitches therebetween in the wafer FOUP are different from those for the ER FOUP. The wafer FOUP has shelf-shaped holding portions and the number of the shelf-shaped holding portions corresponds to the number of wafers W to be accommodated. The ER FOUP is configured to accommodate the edge rings ER such that the number of edge rings ER in the ER FOUP corresponds to the number of the processing modules PM of the system 1, for example. The structure of the container will be described in detail later.

Each of the load ports LP can mount both of the wafer FOUP and the ER FOUP. However, it is also possible to provide a load port LP on which the wafer FOUP can be mounted, a load port on which the ER FOUP can be mounted, and a load port LP on which both of the wafer FOUP and the ER FOUP can be mounted.

The aligner AU is disposed on one of the short sides of the atmospheric pressure transfer chamber 20. The aligner AU includes a rotatable table for mounting thereon the wafer W and an optical sensor for optically detecting an outer peripheral edge of the wafer W. The aligner AU aligns the wafer W by detecting, for example, an orientation flat or a notch of the wafer W.

The processing modules PMs, the vacuum transfer chamber 10, the first transfer mechanism 15, the load-lock modules LLMs, the atmospheric pressure transfer chamber 20, the second transfer mechanism 25, the load ports LPs, and the aligner AU are connected to and controlled by the controller 30.

The controller 30 is an information processing device for controlling the respective components of the system 1. The controller 30 may have any configuration and function. The controller 30 includes, for example, a storage unit 31, a processing unit 32, an input/output interface (IO I/F) 33, and a display unit 34. The storage unit 31 may be any storage device, for example, a hard disk, an optical disk, a semiconductor memory device, or the like. The processing unit 32 may be a processor such as a central processing unit (CPU), or a micro processing unit (MPU), for example. The display unit 34 may be a functional unit that displays information such as a liquid crystal screen or a touch panel. The processing unit 32 reads out and executes a program and a recipe stored in the storage unit 31 to control the individual components of the system 1 through the input/output interface 33.

(Example of the Container)

Figure 2:
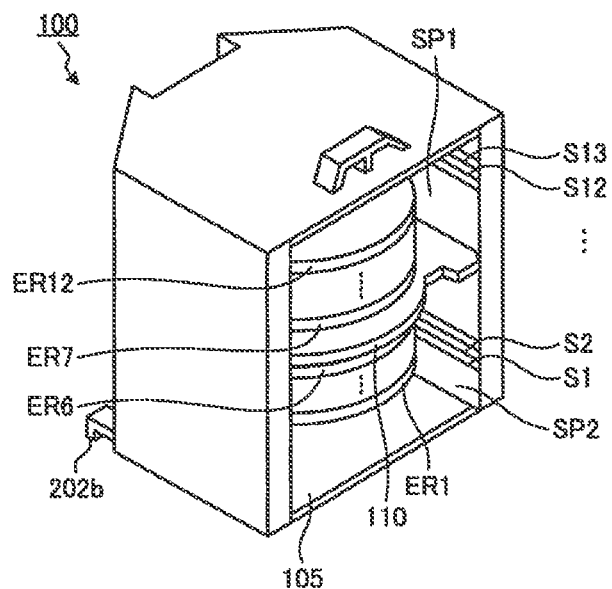
FIG. 2 schematically shows an example of a container according to the embodiment.
Figure 5:
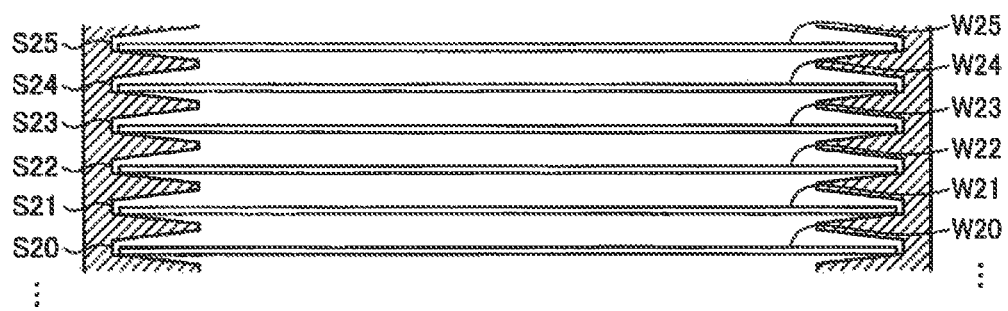
FIG. 5 shows a state in which wafers are disposed in slots of the FOUP for wafer.

FIG. 2 schematically shows an example of a container according to the embodiment. The container shown in FIG. 2 is an ER FOUP 100. The ER FOUP 100 is configured to accommodate used edge rings ER1 to ER6 having a predetermined thickness T1 and unused edge rings ER7 to ER12. The ER FOUP 100 may be configured to accommodate multiple edge rings ER more or less than the twelve edge rings. The edge rings ER1 to ER12 are loaded and unloaded through an opening 105 formed on the front surface of the ER FOUP 100. The opening 105 is provided with a lid (not shown). The edge rings ER1 to ER12 are accommodated one by one in the slots S1 to S6 and S8 to S13 among the slots S1 to S13, which are arranged at regular intervals on the inner walls on both sides of the ER FOUP 100. The slots S1 to S6 and S8 to S13 have, e.g., a substantially V-shaped cross-section, and accommodate the peripheral portions of the edge rings ER1 to ER12 with a margin (gap) (see FIG. 5). Each of the slots S1 to S13 is an example of the holding portion.

Figure 3:
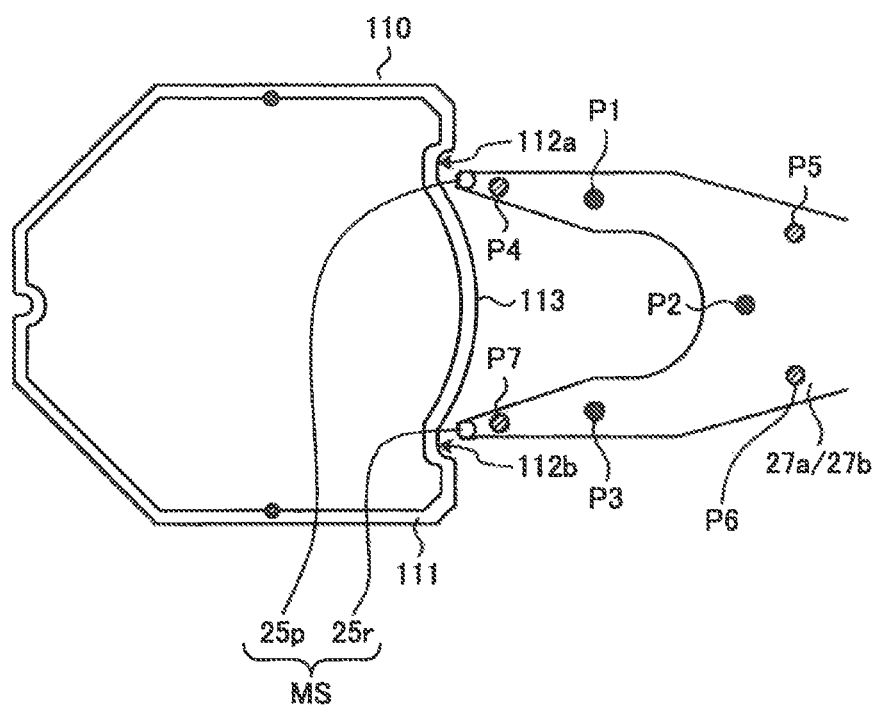
FIG. 3 schematically shows an example of a partition plate according to the embodiment.

A partition plate 110 is inserted into the slot S7 of the ER FOUP 100. FIG. 3 schematically shows an example of the partition plate 110 according to the embodiment. The partition plate 110 has an outer peripheral shape corresponding to the shape of the inner wall of the ER FOUP 100. A sealing portion 111 is formed at the outer periphery of the partition plate 110 so that the partition plate 110 is brought into close contact with the inner wall of the ER FOUP 100 and divides the inner space of the ER FOUP 100 into two spaces, i.e., a first space SP1 and a second space SP2. The partition plate 110 has a first notch 112a and a second notch 112b formed at the front surface of the partition plate 110, i.e., on the opening 105 side of the ER FOUP 100. The first notch 112a and the second notch 112b have a shape corresponding to the shape of the tip ends of the pick (the first pick 27a or the second pick 27b) where the mapping sensor MS of the second transfer mechanism 25 is provided. As shown in FIG. 3, a first portion (curved portion) 113 that swells toward the outside is formed between the first notch 112a and the second notch 112b. When a light emitting part 25p and a light receiving part 25r (both to be described later) of the mapping sensor MS are respectively disposed in the depressed portions of the first notch 112a and a second notch 11, the first portion 113 is disposed between the light emitting part 25p and the light receiving part 25r. The partition plate 110 has a thickness that is greater than a thickness T2 of the wafer W and substantially the same as the thickness T1 of the edge ring ER.

The wafer FOUP has the same configuration as that of the ER FOUP 100 shown in FIG. 2. Since, however, the predetermined thickness T2 of the wafer W is smaller than the thickness T1 of the edge ring ER, the number of the slots and the pitches between the slots in the wafer FOUP are different from those in the ER FOUP 100. For example, the wafer FOUP has 25 slots S1 to S25, and the wafers W1 to W25 are respectively accommodated in the slots S1 to S25. The partition plate 110 cannot be accommodated in any of the slots of the wafer FOUP due to the pitch difference between the slots of the wafer FOUP and the slots of the ER FOUP 100.

(Loading/Unloading of the Wafer and Edge Ring)

Figure 4:
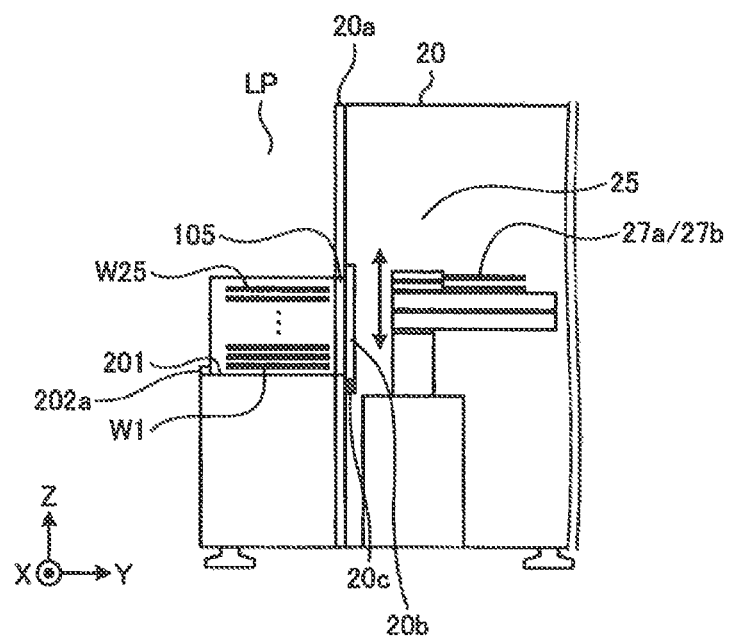
FIG. 4 shows a state in which a Front Opening Unified Pod (FOUP) for wafer is installed at the system according to the embodiment.

FIG. 4 shows a state in which the wafer FOUP is installed in the system 1 according to the embodiment. FIG. shows a state in which wafers are disposed in slots of the wafer FOUP. The same states are obtained when the ER FOUP is installed in the system 1.

Referring to FIG. 4, the wafer FOUP is mounted on a table 201 on the load port LP. In a state where the wafer FOUP is mounted on the table 201, the slots S1 to S25 respectively hold the wafers W1 to W25 at regular intervals in a vertical direction as shown in FIG. 4. At this time, the wafers W1 to W25 are held with surfaces (surface on which semiconductor devices are to be formed) as upper surfaces (surfaces facing upward when the wafers W are held horizontally). The peripheral edges of the wafers W1 to W25 are respectively held by lower sloped surfaces of the slots S1 to S25, each having the substantially V-shaped cross-section. Therefore, the slots S1 to S25 can substantially horizontally hold the wafers W1 to W25 each having the predetermined thickness T2 at predetermined intervals (see FIG. 5).

A window 20b is formed at a position on a boundary wall 20a that corresponds to a position where the wafer FOUP is mounted. A window opening/closing mechanism 20c for opening and closing the window 20b using, e.g., a shutter is disposed on the atmospheric pressure transfer chamber 20 side of the window 20b. The window opening/closing mechanism 20c can open and close the lid of the wafer FOUP. Thus, the window 20b and the lid of the wafer FOUP are opened and closed simultaneously by the window opening/closing mechanism 20c. If the window 20b is opened so that the wafer FOUP communicates with the atmospheric pressure transfer chamber 20, the second transfer mechanism disposed in the atmospheric pressure transfer chamber 20 can access the wafer FOUP so that the loading and unloading of the wafer W into and from the wafer FOUP can be performed. The window opening/closing mechanism 20c is preferably provided with an interlock so that it does not operate when the wafer FOUP is not mounted at a predetermined position on the table 201. The wafer FOUP has a fixer 202a for fixing the wafer FOUP on the table 201 so that the wafers W accommodated in the wafer FOUP can be arranged on a transfer path to the processing module PM. Similarly, the ER FOUP has a fixer 202b (see FIG. 2) for fixing the ER FOUP on the table 201 so that the edge rings ER accommodated in the ER FOUP can be arranged on a transfer path to the processing module PM. The mechanism for fixing the ER FOUP and the wafer FOUP on the table 201 may have any configuration.

FIG. 6 is a schematic perspective view of the second transfer mechanism 25. FIG. 7 is a schematic front view of the second transfer mechanism 25. On the base 25d of the second transfer mechanism 25 in the atmospheric pressure transfer chamber 20, a rod 25c that is raised and lowered by rotation of a servomechanism (not shown) is disposed. An arm 25a is connected on the rod 25c, and thus the arm 25a can move in the Z-axis direction (see FIG. 1) by the vertical movement of the rod 25c. As shown in FIG. 6, the arm 25a is a multi-joint arm. Thus, the arm 25a can also move in the X-Y plane. The first pick 27a and the second pick 27b are rotatably connected to the tip end of the arm 25a. Accordingly, the second transfer mechanism 25 can access the entire wafer FOUPs or the entire ER FOUPs 100 mounted on the tables 201 by moving the arm 25a, the first pick 27a, and the second pick 27b. The second transfer mechanism 25 can access the slots S1 to S25 in the wafer FOUP or the slots S1 to S13 in the ER FOUP 100 at any height. Further, the second transfer mechanism 25 can access the load-lock modules LLM1 and LLM2 and transfer the wafer W or the edge ring ER.

At least one of the first pick 27a and the second pick 27b, connected to the tip end of the arm 25a, includes the mapping sensor MS (see FIG. 3). In addition, pads P1 to P3 to be in contact with the wafer W during the transfer of the wafer W are disposed on the upper surface of each of the first pick 27a and the second pick 27b (see FIG. 3). Further, pads P4 to P7 to be in contact with the edge ring ER during the transfer of the edge ring ER are disposed on the upper surface of each of the first pick 27a and the second pick 27b (see FIG. 3). The pads P1 to P7 may be composed of any material and have any shape. The pads P1 to P7 are preferably configured to prevent the wafer W or the edge ring ER from being damaged or dropped during the transfer of the wafer W or the edge ring ER. The first pick 27a and the second pick 27b can be independently controlled. Since the first pick 27a and the second pick 27b have the same configuration, the first pick 27a will be mainly described below.

The first pick 27a is a plate having a width and a length that allow the wafer W to be mounted on the upper surface thereof. The first pick 27a is movable in a forward-backward direction (Y-axis direction in FIG. 1) and in a left-right direction (X-axis direction in FIG. 1) with respect to the base 25d through the arm 25a by a driving unit (not shown). Since the first pick 27a is disposed on the rod 25c that can be raised and lowered in the Z-axis direction by the rotation of the servo motor of the above-described servo mechanism (not shown), the first pick 20a can be moved in the Z-axis direction shown in FIG. 1. When the first pick 27a is moved horizontally to a lower rear position in the FOUP through the gap between the wafers W and then raised vertically from the lower rear position, the pads P1 to P3 disposed on the pick 27a are brought into contact with the backside of the wafer W positioned at an upper side of the pick 27a. In other words, the wafer W can be mounted on the first pick 27a by bringing the pads P1 to P3 into contact with the wafer W. The edge ring ER can be loaded and unloaded in the same manner as the loading and unloading of the wafer W. However, during the loading and unloading of the edge ring ER, the edge ring ER is brought into contact with the pads P4 to P7 on the first pick 27a.

Next, the mapping sensor MS will be described. The mapping sensor MS is the detector including the light emitting part 25p and the light receiving part 25r. FIG. 3 shows an example in which the light emitting part 25p is disposed at a first end of the first pick 27a and the light receiving part 25r is disposed at a second end of the first pick 27a. The light emitting part 25p is a light emitting element, for example, a light emitting diode such as a laser diode or an LED. The light receiving part 25r is a light receiving element such as a phototransistor or a photodiode. The light emitting part 25p and the light receiving part 25r are driven by a driving circuit (not shown). When no object exists between the light emitting part 25p and the light receiving part 25r, the light beam emitted from the light emitting part 25p is incident on the light receiving part 25r and a "H" level output signal is outputted from the light receiving part 25r, for example. On the other hand, when an object exists between the light emitting part 25p and the light receiving part 25r, the light beam emitted from the light emitting part 25p is interrupted by the object. Therefore, the light beam is not incident on the light receiving part 25r and an "L" level output signal is outputted from the light receiving part 25r. The output signals from the light receiving part 25r are transmitted to the controller 30 as sensor detection signals. The mapping sensor MS is configured to detect the thickness of the object based on a value corresponding to the length of the period in which the L level output signal is detected. Further, by setting the output signal of the mapping sensor MS to a pulse signal of a predetermined cycle, the controller 30 can detect the movement amount and the current position of the first pick 27a based on the pulse signals. For example, the controller 30 detects the position of the first pick 27a moved from the initial position based on the number of pulse signals.

As shown in FIG. 3, the size of the distance between the light emitting part 25p and the light receiving part 25r is selected such that the first pick 27a can enter the inner side of the sidewalls of the wafer FOUP and the ER FOUP and the wafer W and the edge ring ER can be partially disposed horizontally between the light emitting part 25p and the light receiving part 25r. Accordingly, the light emitting part 25p and the light receiving part 25r are configured to detect information on the thickness and the position of each of the wafers W1 to W25 accommodated in the wafer FOUP and the thickness and the position of each of the edge rings ER1 to ER12 accommodated in the ER FOUP.

The controller 30 may use a threshold to determine a thickness of an object detected by the mapping sensor MS. For example, the mapping sensor MS switches the threshold for detecting the thickness between the transfer of the wafer W and the transfer of the edge ring ER. Generally, the thickness T2 of the wafer W is smaller than the thickness T1 of the edge ring ER. For example, the thickness T2 of the wafer W is 1 mm or less, and the thickness T1 of the edge ring ER is 3 mm or more. Therefore, in the case of transferring the wafer W, the threshold of the mapping sensor MS may be set depending on the thickness T2. In the case of transferring the edge ring ER, the threshold of the mapping sensor MS may be switched to a threshold set depending on the thickness T1.

Accordingly, when the operator mistakenly attempts to load the wafer W in the ER FOUP during the transfer of the wafer W while the edge ring ER is accommodated in the ER FOUP, the mapping sensor MS detects an object having a thickness greater than a set threshold. When the object having the thickness greater than the threshold is detected, the controller 30 stops the operation of the second transfer mechanism 25 based on information transmitted from the mapping sensor MS to the controller 30. The controller 30 may display a warning on the display unit 34.

However, when the operator mistakenly attempts to load the wafer W into the ER FOUP while neither the edge ring ER nor the wafer W is accommodated in the FOUP, no object is detected by the mapping sensor MS and the controller 30 cannot stop the operation of the second transfer mechanism 25. Therefore, in the present embodiment, the partition plate 110 having a thickness greater than the thickness of the wafer W is disposed in the ER FOUP. Further, in order to perform the detection of the mapping sensor MS, the partition plate 110 is provided with the first notch 112a and the second notch 112b.

The partition plate 110 is preferably positioned at the slot S7 of the ER FOUP 100. This is because if unused edge rings ER are to be accommodated in the upper slots S8 to S13 and used edge rings ER are to be accommodated in the lower slots S1 to S6, it is possible to suppress contamination of the unused edge rings ER from a gas released from the used edge rings ER or the like. However, the arrangement position of the partition plate 110 is not particularly limited thereto, and the partition plate 110 may be inserted into any slot.

The partition plate 110 may have a thickness that allows erroneous transfer to be detected depending on the setting of the threshold of the mapping sensor MS. For example, the thickness of the partition plate 110 may be set to be greater than the threshold for the wafer W and the threshold for the edge ring ER. Further, the thickness of the partition plate 110 may be set to be greater than the threshold for the wafer W and smaller than or equal to the threshold for the edge ring ER. However, if an upper limit and a lower limit are set for the threshold for the wafer W, when the thickness of the partition plate 110 is smaller than or equal to the lower limit, the rigidity of the partition plate 110 is decreased. Therefore, it is preferred to set the thickness of the partition wall 110 to be greater than the upper limit of the threshold.

The FOUP may be made of transparent antistatic polycarbonate, for example. The sidewall of the FOUP is antistatic.

In the above-described embodiment, the mapping sensor MS is disposed on the pick of the second transfer mechanism 25. However, the position of the mapping sensor MS is not limited thereto. For example, the mapping sensor MS may be disposed at the left side and the right side of the opening of the FOUP (for example, at the left inner wall and the right inner wall of the FOUP) and transmit the detection result to the controller 30.

Further, the sealing portion for bringing the partition plate 110 into close contact with the inner wall of the FOUP may be disposed at the partition plate 110 or at the inner wall of the FOUP.

The consumable that is accommodated in the FOUP and transferred into and from the FOUP is not limited to the edge ring ER. In the case of transferring a different consumable in the same manner, the threshold of the mapping sensor MS and the thickness of the partition plate 110 are appropriately adjusted.

(Transfer Method According to the Embodiment)

FIG. 8 is a flowchart showing an example of a sequence of a method of transferring the substrate according to the embodiment. For example, when an operator manually operates the second transfer mechanism 25 to load the wafer W into the FOUP, the processes illustrated in FIG. 8 are performed under the control of the controller 30.

First, the FOUP is installed at the load port LP by the operator (step S81). When the FOUP is installed, the operator specifies the type of the FOUP and stores the specified FOUP type in the system 1. Then, the second transfer mechanism 25 transfers the wafer W in response to an instruction inputted by the operator. For example, the second transfer mechanism 25 receives the wafer from the load-lock module LLM and transfers the wafer W to the opening of the FOUP mounted on the load port LP. In the case of transferring the wafer W, the threshold of the mapping sensor MS is preset to be a threshold for the wafer (step S82). Next, the first pick 27*a* of the second transfer mechanism 25 enters the FOUP through the opening of the FOUP. The second transfer mechanism 25 stops moving forward when the light emitting part 25*p* and the light receiving part 25*r* of the first pick 27*a* reach the positions shown in FIG. 3. Then, the first pick 27*a* detects the thickness of the object in the FOUP while moving in the Z-axis direction in front of the FOUP (step S83). The information on the detected thickness is transmitted to the controller 30. The controller 30 determines whether or not the thickness detected by the mapping sensor MS exceeds the threshold (step S84). When it is determined that the thickness exceeding the threshold is detected (YES in step S84), the controller 30 stops the operation of the second transfer mechanism 25 (step S85). On the other hand, when it is determined that the thickness exceeding the threshold is not detected (NO in step S84), the controller 30 completes the processing. Then, the operator can continue the transfer of the wafer W.

As described above, the system 1 of the present embodiment can continue or stop the transfer operation depending on the thickness of the object in the FOUP. Therefore, even when the type of the FOUP stored in the system 1 by the operator is incorrect, the system 1 can prevent the wafer W from being erroneously transferred and damaged. In FIG. 8, the case where the transfer operation is performed based on the instruction inputted by the operator has been described as an example. However, the transfer operation of FIG. 8 may also be performed in the case where the FOUP is installed at the load port LP and the controller 30 automatically reads, for example, an identifier indicating the type of the FOUP from the FOUP. For example, even when the controller 30 misreads the type of FOUP and attempts to load the wafer W into the ER FOUP, the erroneous transfer can be prevented by the processes illustrated in FIG. 8. The controller 30 may notify the operator of the information on empty slots based on information detected by the mapping sensor MS while performing the processes illustrated in FIG. 8. Further, the controller 30 may update the information on the FOUP stored in the storage unit 31 based on the detection result while performing the processes illustrated in FIG. 8.

(Effect of the Embodiment)

As described above, the container for consumables according to the embodiment includes the multiple holding portions, the partition plate, and the fixer. Each of the holding portions is configured to accommodate one consumable that is loaded and unloaded in one direction. The partition plate includes the first portion formed to be disposed between the light emitting part and the light receiving part of the detector. The partition plate is accommodated in one of the multiple holding portions. The fixer is configured to fix the container so that the consumables are arranged on a transfer path to be loaded into and unloaded from the multiple holding portions. Therefore, the detector can detect the presence of the partition plate in the container.

Further, the partition plate has a thickness greater than a thickness of the substrate. Therefore, the detector can detect that the container is not the container for the substrate.

Further, the partition plate has substantially the same thickness as that of the consumable. Therefore, the detector can detect that the container is the container for the consumable.

Further, the partition plate is in close contact with the wall surface of the container and separates the inner space of the container into the first space including a part of the multiple holding portions and the second space including the other part of the multiple holding portions. Therefore, the partition plate can prevent unused consumables from being contaminated by used consumables stored in the container.

Further, the first portion of the partition plate is formed to be disposed between the two notches having shapes corresponding to the shapes of the light emitting part and the light receiving part, respectively. Therefore, the detection can be performed without being interrupted by the partition plate.

The partition plate of the container according to the embodiment is thicker than the substrate, and the first portion of the partition plate is formed to be disposed between the light emitting part and the light receiving part of the detector. Further, the partition plate of the container can be accommodated, instead of the consumable, in the container for accommodating the consumable to be disposed in the substrate processing space. Therefore, it is possible to prevent the substrate from being loaded into the container for the consumable without changing the configuration of the container. Accordingly, the substrate can be prevented from being damaged due to erroneous transfer.

The system according to the embodiment includes the vacuum processing chamber, the arm, the detector, and the controller. The vacuum processing chamber provides the processing space where the consumable is disposed and the substrate is processed. The arm is disposed on the transfer path between the vacuum processing chamber and the container that accommodates the consumable or the substrate. The arm transfers the consumable or the substrate. The detector includes the light emitting part disposed at the first end of the pick connected to the tip end of the arm and the light receiving part connected to the second end of the pick. The controller controls the detector to detect the thickness of the component disposed in the container and stops the transfer of the substrate by the arm when the detected thickness exceeds the threshold. Therefore, the system can prevent erroneous transfer of the substrate.

The method of transferring a substrate according to the embodiment includes: using the detector to detect the thickness of the component in the container that is disposed on the transfer path of the consumable and the substrate and configured to store the consumable or the substrate, the detector including the light receiving part disposed at the first end of the pick for transferring the consumable disposed in the vacuum processing chamber and the substrate processed in the vacuum processing chamber, and the light emitting part disposed at the second end of the pick; and stopping the transfer of the substrate when the detected thickness exceeds the threshold. Therefore, the method can prevent erroneous transfer of the substrate.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A container for consumables, comprising:
   an inner wall;
   multiple holding portions configured to respectively accommodate the consumables, each of which is loaded and unloaded in one direction;
   a partition plate including a first portion formed to be disposed between a light emitting part of a detector and a light receiving part of the detector, wherein the partition plate is accommodated in one of the multiple holding portions; and
   a fixer configured to fix the container so that the consumables are arranged on a transfer path to be loaded into and unloaded from the multiple holding portions,
   wherein the partition plate comprises a sealing portion formed at an outer periphery of the partition plate,
   wherein the outer periphery of the partition plate has a vertically extending outwardly facing outer peripheral shape corresponding to a vertically extending inwardly facing inner peripheral shape of the inner wall of the container, and the outer periphery of the partition plate is in contact with the inner wall of the container via the sealing portion along the inner wall of the container, so that the vertically extending outwardly facing outer peripheral shape of the partition plate contacts the vertically extending inwardly facing inner peripheral shape of the inner wall of the container and the partition plate separates an inner space of the container into a first space including a part of the multiple holding portions and a second space including the other part of the multiple holding portions, and
   wherein the container defines an enclosure which is configured to enclose the inner space of the container when a lid is closed, and contact the between the partition plate and the inner wall maintains the first space separate from the second space in the enclosure.

2. The container of claim 1, wherein the partition plate has a thickness greater than a thickness of a substrate.

3. The container of claim 1, wherein the partition plate has substantially the same thickness as a thickness of the consumables.

4. The container of claim 1, wherein the first portion is disposed between two notches of the partition plate, the two notches having shapes corresponding to shapes of the light emitting part and the light receiving part, respectively.

5. The container of claim 2, wherein the partition plate has substantially the same thickness as a thickness of the consumables.

6. The container of claim 2, wherein the first portion is disposed between two notches of the partition plate, the two notches having shapes corresponding to shapes of the light emitting part and the light receiving part, respectively.

7. The container of claim 5, wherein the first portion is disposed between two notches of the partition plate, the two notches having shapes corresponding to shapes of the light emitting part and the light receiving part, respectively.

8. The container of claim 3, wherein the first portion is disposed between two notches of the partition plate, the two notches having shapes corresponding to shapes of the light emitting part and the light receiving part, respectively.

9. The container of claim 1, wherein the container includes an opening, and the partition plate is accommodated in one of the multiple holding portions in a mounted position, and
   wherein the partition plate includes a first notch and a second notch which face toward the opening of the container in the mounted position.

10. The container of claim 9, wherein the first portion of the partition plate is between the first notch and the second notch, and the first portion includes a curved portion which protrudes toward the opening in the mounted position.

* * * * *